(12) United States Patent
Ma et al.

(10) Patent No.: US 10,187,031 B2
(45) Date of Patent: Jan. 22, 2019

(54) TUNABLE MATCHING NETWORK

(71) Applicant: QUALCOMM Incorporated, San Diego, CA (US)

(72) Inventors: Yunfei Ma, Santa Clara, CA (US); Chengjie Zuo, San Diego, CA (US); David Francis Berdy, San Diego, CA (US); Daeik Daniel Kim, Del Mar, CA (US); Changhan Hobie Yun, San Diego, CA (US); Je-Hsiung Jeffrey Lan, San Diego, CA (US); Mario Francisco Velez, San Diego, CA (US); Niranjan Sunil Mudakatte, San Diego, CA (US); Robert Paul Mikulka, Oceanside, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 76 days.

(21) Appl. No.: 15/151,351

(22) Filed: May 10, 2016

(65) Prior Publication Data

US 2017/0331445 A1 Nov. 16, 2017

(51) Int. Cl.
*H03H 7/38* (2006.01)
*H03H 7/40* (2006.01)
*H04B 1/04* (2006.01)

(52) U.S. Cl.
CPC ............. *H03H 7/38* (2013.01); *H04B 1/0458* (2013.01); *H03H 7/40* (2013.01)

(58) Field of Classification Search
CPC .................................. H03H 7/38; H03H 7/40
USPC .......................................................... 333/32
See application file for complete search history.

(56) References Cited

U.S. PATENT DOCUMENTS

| | | | |
|---|---|---|---|
| 8,922,315 B2 | 12/2014 | Shanny et al. | |
| 8,963,644 B2 | 2/2015 | Ma et al. | |
| 9,002,306 B2 | 4/2015 | Li et al. | |
| 9,166,640 B2 | 10/2015 | Bakalski | |
| 2008/0123771 A1* | 5/2008 | Cranford ............ | H04L 25/0278 375/285 |
| 2011/0051308 A1 | 3/2011 | Chan | |
| 2012/0043968 A1* | 2/2012 | Kojima .............. | G01R 31/2851 324/537 |
| 2012/0127049 A1 | 5/2012 | Kato | |

(Continued)

FOREIGN PATENT DOCUMENTS

| | | |
|---|---|---|
| WO | 2012154840 A2 | 11/2012 |
| WO | 2015105672 A1 | 7/2015 |

OTHER PUBLICATIONS

International Search Report and Written Opinion—PCT/US2017/020993—ISA/EPO—May 16, 2017, 13 pages.

*Primary Examiner* — Stephen E. Jones
*Assistant Examiner* — Samuel S Outten
(74) *Attorney, Agent, or Firm* — Qualcomm Incorporated-Toler (57) ABSTRACT

A tunable matching network is disclosed. In a particular example, the matching network includes at least one first inductor in a signal path of the matching network. The matching network includes at least one second inductor outside of the signal path. The matching network includes one or more switches coupled to the at least one second inductor. The one or more switches are configured to selectively enable mutual coupling of the at least one first inductor and the at least one second inductor.

18 Claims, 8 Drawing Sheets

(56) References Cited

U.S. PATENT DOCUMENTS

| | | | |
|---|---|---|---|
| 2013/0207730 A1* | 8/2013 | Lee | H01L 29/93 330/296 |
| 2013/0207739 A1* | 8/2013 | Bakalski | H03H 7/40 333/33 |
| 2014/0028521 A1* | 1/2014 | Bauder | H03H 7/38 343/861 |
| 2015/0194944 A1* | 7/2015 | Joshi | H04B 1/0458 327/551 |
| 2015/0207536 A1 | 7/2015 | Yehezkely et al. | |
| 2016/0126618 A1 | 5/2016 | Strange | |
| 2017/0070202 A1* | 3/2017 | Yang | H03H 7/09 |

* cited by examiner

FIG. 6

TUNABLE MATCHING NETWORK

I. FIELD

The present disclosure is generally related to tunable matching networks.

II. DESCRIPTION OF RELATED ART

Advances in technology have resulted in smaller and more powerful computing devices. For example, a variety of portable personal computing devices, including wireless telephones such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

These devices may include impedance matching networks (e.g., matching filters). Impedance matching networks may be tuned to match impedances (e.g., in a radio frequency (RF) front end) at different frequencies. In some examples, variable impedance electrical components, such as variable capacitors (varactors), are used to tune the matching networks to impedance match at different frequencies. However, this approach may result in nonlinearity, harmonic generation, and efficiency loss of the matching network.

III. SUMMARY

A matching network may include switched inductors that are outside of a signal path of the matching network. The switched inductors may be switched using at least one switch (e.g., a multi-way switch or a switch matrix). The at least one switch may be configured to enable selections between various configurations of the switched inductors. Each of the various configurations may induce a different mutual coupling between the switched inductors and an inductor in a signal path of the matching network. Varying a mutual coupling between the switched inductors and the inductor in the signal path changes an impedance of the signal path. Varying an impedance of the signal path of the matching network changes an impedance or reactance of the matching network, enabling the matching network to impedance match at different frequencies.

In a particular example, a device includes at least one first inductor in a signal path of a matching network. The device further includes at least one second inductor outside of the signal path. The matching network further includes one or more switches coupled to the at least one second inductor. The one or more switches are configured to selectively enable mutual coupling of the at least one first inductor and the at least one second inductor.

In a particular example, a device includes at least one first inductor in a signal path of a matching network. The device includes at least one second inductor outside of the signal path. The at least one second inductor is configured to vary an impedance of the matching network by selective mutual coupling between the at least one second inductor and the at least one first inductor.

In a particular example, a method of tuning a matching network includes receiving a control signal to tune a matching network. The method further includes selectively enabling or disabling, responsive to the control signal, current through at least one auxiliary inductor that is coupled to a primary inductor located along a signal path of the matching network.

Other aspects, advantages, and features of the present disclosure will become apparent after review of the entire application, including the following sections: Brief Description of the Drawings, Detailed Description, and the Claims.

V. DETAILED DESCRIPTION

Figure 1:
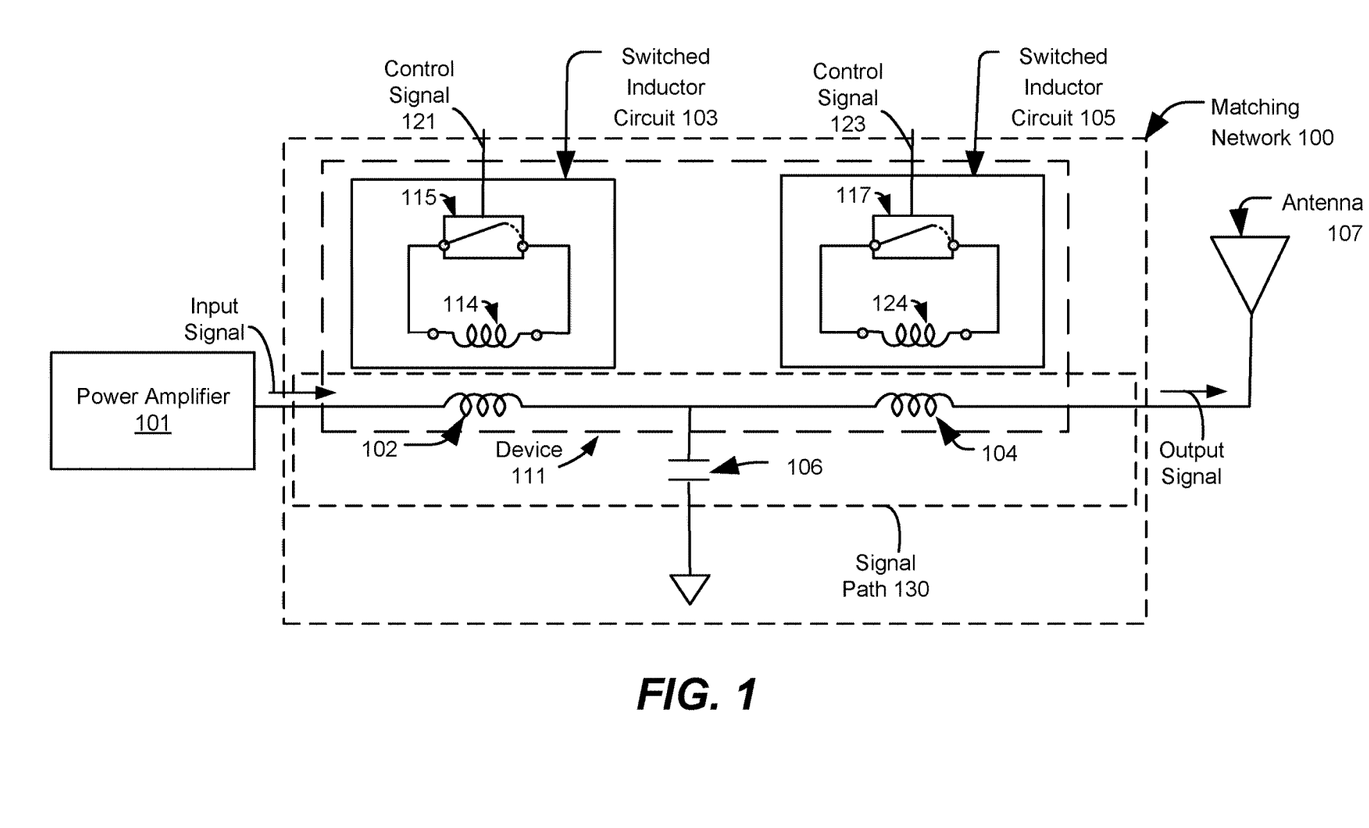
FIG. 1 is a particular illustrative example of a matching network (between a power amplifier and an antenna) including switched inductors outside of a signal path of the matching network.

Referring to FIG. 1, a particular illustrative example of a device that includes switched inductors outside of a signal path of a matching network 100 is disclosed and generally designated 111. The matching network 100 may include the device 111. The matching network 100 may be coupled to a power amplifier 101 and an antenna 107. The matching network 100 may be configured to match an impedance at an input of the antenna 107 to an impedance as seen at an output of the power amplifier 101.

The matching network 100 includes a signal path 130 (e.g., between the power amplifier 101 and the antenna 107) through which a signal is transmitted. The device 111 includes at least one first inductor (e.g., a primary inductor) in (e.g., along) the signal path 130 of the matching network 100. For example, the matching network 100 may include a T-type network (e.g., a T-type inductor (L) capacitor (C) network). In this example, the at least one first inductor of the device 111 may include an inductor 102, an inductor 104, or both. Although the matching network 100 is illustrated as a T-type network, in other examples, the matching network 100 may include other types of networks, such as a pi-type network (in which case the at least one inductor may correspond to an inductor of the pi-type network).

Figure 2A:
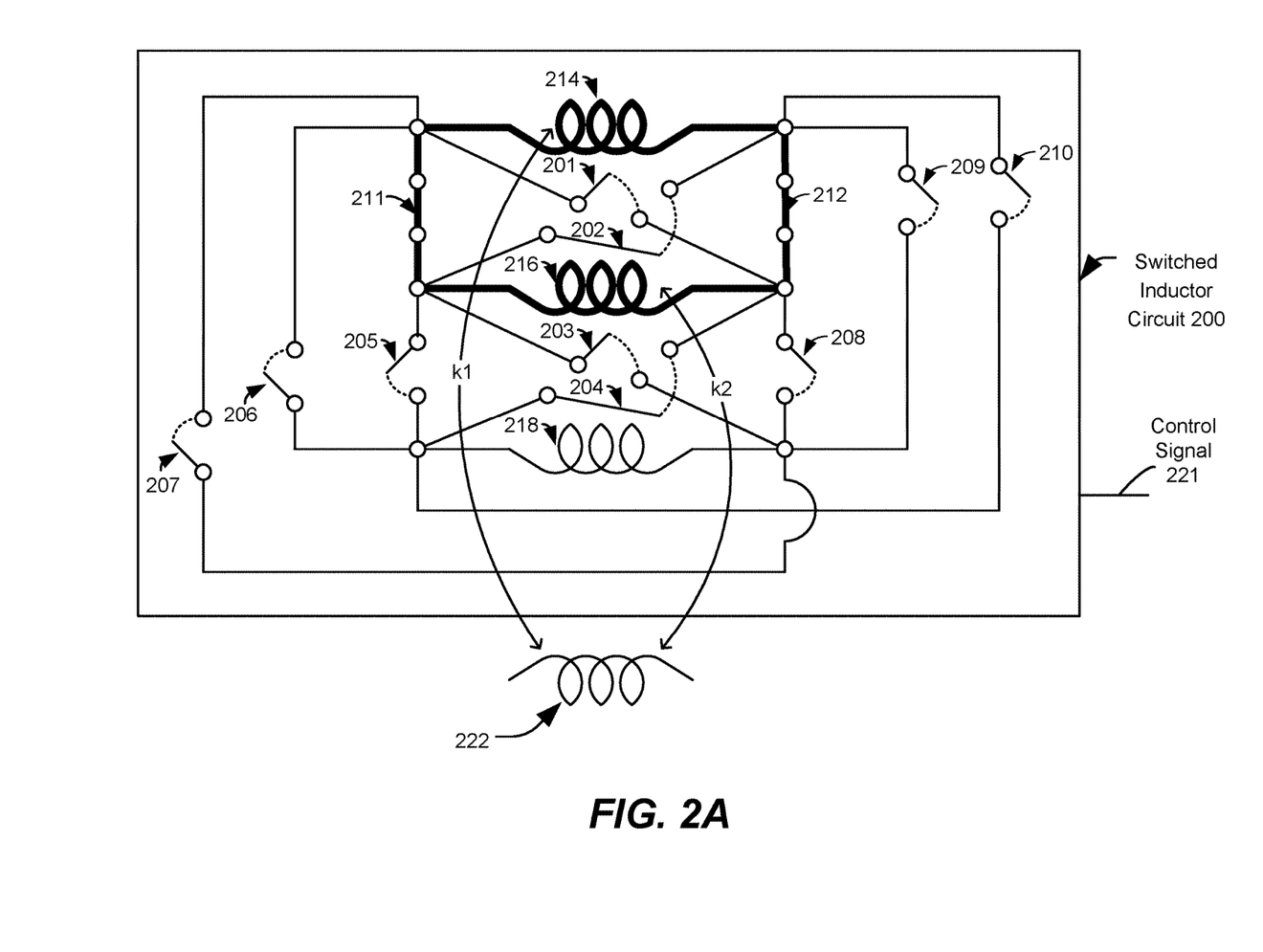
FIG. 2A is a particular illustrative example of an inductor in a signal path of a matching network and a switched inductor circuit including multiple auxiliary inductors that are in a first particular configuration.
Figure 2B:
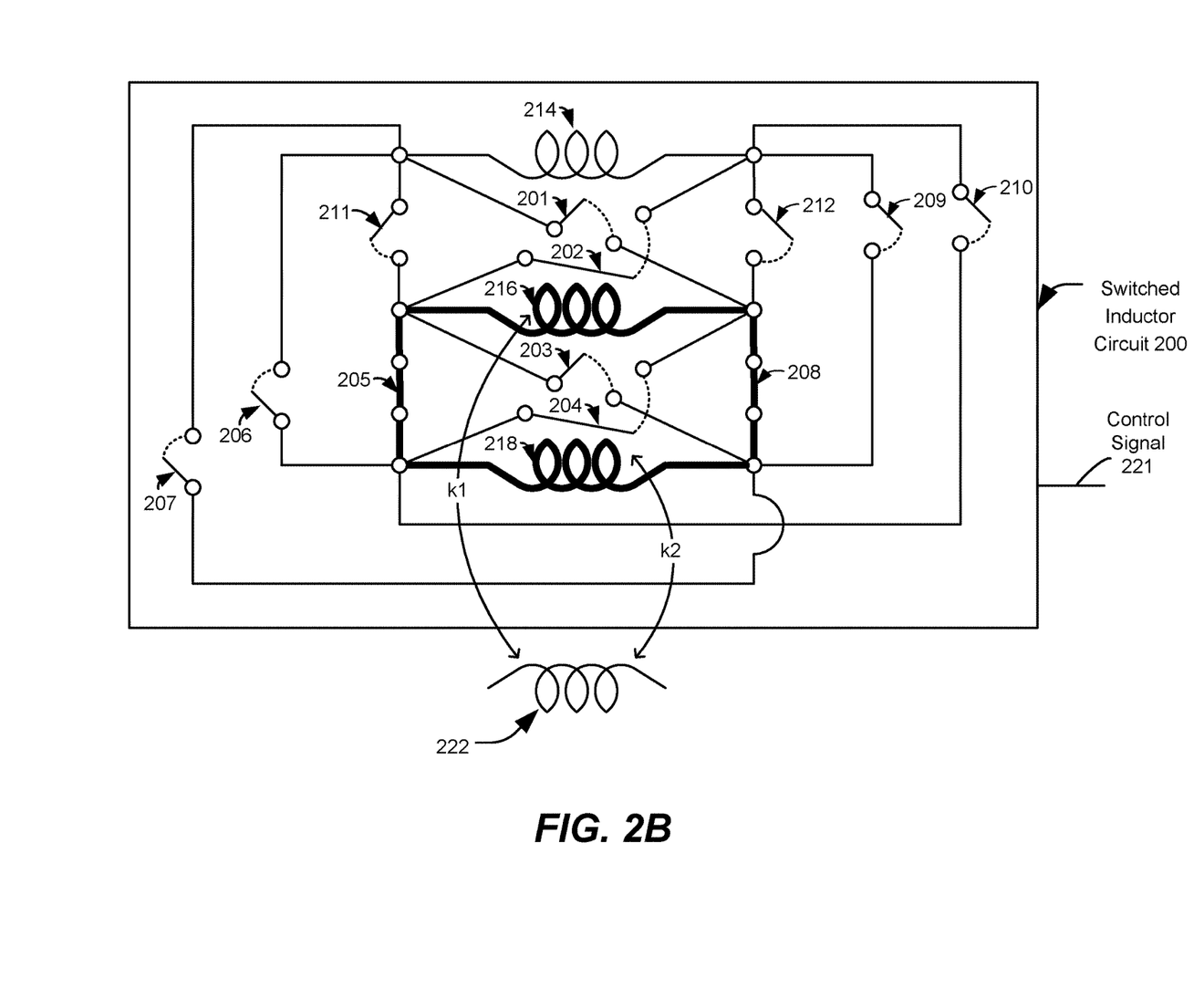
FIG. 2B is a particular illustrative example of the inductor in the signal path of the matching network of FIG. 2A and the switched inductor circuit of FIG. 2A in a second particular configuration.
Figure 2C:
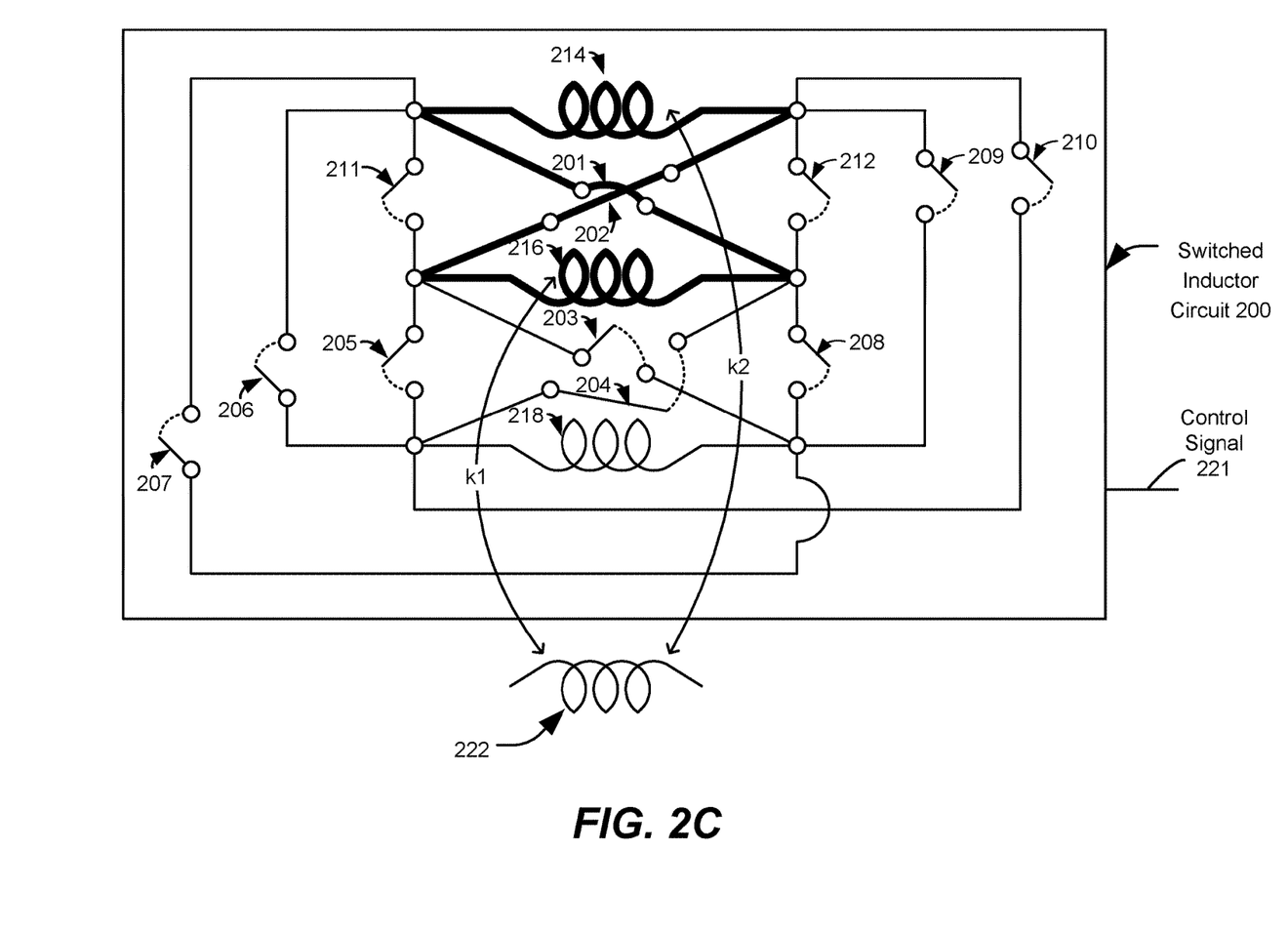
FIG. 2C is a particular illustrative example of the inductor in the signal path of the matching network of FIG. 2A and the switched inductor circuit of FIG. 2A in a third particular configuration.

The device 111 further includes at least one second inductor (e.g., an auxiliary inductor) outside of the signal path 130. The at least one second inductor may be included in a switched inductor circuit. For example, the device 111 may include a switched inductor circuit 103 associated with the inductor 102, a switched inductor circuit 105 associated with the inductor 104, or both. As an example, the at least one second inductor may include an inductor 114 (of the switched inductor circuit 103) proximate to and associated with the inductor 102, an inductor 124 (of the switched inductor circuit 105) proximate to and associated with the inductor 104, or both. Although FIG. 1 illustrates each of the switched inductor circuits 103 and 105 as including a single second inductor, in other examples the at least one second inductor includes multiple inductors (e.g., a plurality of inductors). For example, FIGS. 2A, 2B, and 2C illustrate various configurations of switched inductor circuits that include a plurality of inductors (e.g., a plurality of second inductors). Thus, the at least one second inductor (e.g., associated with the at least one first inductor) may include one inductor or multiple inductors.

The device 111 includes one or more switches coupled to the at least one second inductor. The one or more switches may be configured to selectively enable mutual coupling of the at least one second inductor and the at least one first inductor. As an example, the one or more switches may include a switch 115 coupled to the inductor 114, a switch 117 coupled to the inductor 124, or both. Although FIG. 1 illustrates each of the switched inductor circuits 103 and 105 as including a single switch, in other examples one or more of the switched inductor circuits 103 or 105 may include multiple switches. For example, FIGS. 2A, 2B, and 2C illustrate various electrical configurations of switched inductor circuits that include multiple switches. Thus, the one or more switches (e.g., coupled to the at least one second inductor) may include multiple switches.

The switch 115 may open or close responsive to a control signal 121 and may be configured to selectively enable mutual coupling of the inductor 114 and the inductor 102. For example, when the switch 115 is closed, current is allowed to flow along the switched inductor circuit 103 (e.g., through the inductor 114), enabling mutual coupling of the inductor 114 and the inductor 102. Alternatively, when the switch 115 is open, current is not allowed to flow along the switched inductor circuit 103 (e.g., may not be allowed to flow through the inductor 114), thereby preventing (or reducing) mutual coupling of the inductor 114 and the inductor 102.

Operation of the switch 115 affects an effective impedance of the inductor 102 by increasing or increasing a mutual inductance due to the inductor 114. In this example, an impedance of the signal path 130 has a first value when the inductor 114 is mutually coupled to the inductor 102 and has a second value when the inductor 114 is not mutually coupled to the inductor 102. For example, an impedance presented by the inductor 114 may be mathematically described by Equation 1, where $L_1$ corresponds to a self-inductance of the inductor 102, $L_2$ corresponds to a self-inductance of the inductor 114, $M_{102,114}$ corresponds to a mutual inductance of the inductor 102 and the inductor 114, and $R_{115}$ corresponds to a resistance presented by the switch 115.

$$Z_{102} = j\omega L_1 - j\omega L_2 \frac{\omega^2 M_{102,114}^2}{R_{115}^2 + \omega^2 L_2^2} + \frac{\omega^2 M_{102,114}^2}{R_{115}^2 + \omega^2 L_2^2} R_{115} \quad \text{Equation (1)}$$

When the switch 115 is closed (e.g., when the switch 115 is in a first configuration), the resistance $R_{115}$ (of Equation 1) presented by the switch 115 may be approximated as zero ohms and the inductor 102 may be mutually coupled to the inductor 114 (e.g., the mutual inductance $M_{102,114}$ of Equation 1 is non-zero). Thus, when the switch 115 is closed, Equation 1 mathematically reduces to Equation 2, which mathematically describes the impedance $Z_{102\_closed}$ presented by the inductor 102 when the switch 115 is closed. Thus, when the switch 115 is closed, the impedance $Z_{102\_closed}$ presented by the inductor 102 is based on the self-inductance $L_1$ of the inductor 102, the self-inductance $L_2$ of the inductor 114, and the mutual inductance $M_{102,114}$ of the inductor 102 and the inductor 114.

$$Z_{102\_closed} = j\omega L_1 - j\omega L_2 \frac{M_{102,114}^2}{L_2^2} \quad \text{Equation (2)}$$

When the switch 115 is open (e.g., when the switch 115 is in a second configuration), the resistance $R_{115}$ (of Equation 1) presented by the switch 115 may be approximated as infinity and the inductor 102 may not be mutually coupled to the inductor 114 (e.g., the mutual inductance $M_{102,114}$ of Equation 1 corresponds to zero). Thus, when the switch 115 is open, Equation 1 mathematically reduces to Equation 3, which mathematically describes the impedance $Z_{102\_open}$ when the switch 115 is open. Thus, when the switch 115 is open, the impedance $Z_{102\_open}$ presented by the inductor 102 may be based on the self-inductance $L_1$ of the inductor 102.

$$Z_{102\_open} = j\omega L_1 \quad \text{Equation (3)}$$

Equations 1-3 demonstrate that an inductance $Z_{102\_closed}$ presented by the inductor 102 when the switch 115 is closed (e.g., when the inductor 102 is mutually coupled to the inductor 114) may be different than an inductance $Z_{102\_open}$ presented by the inductor 102 when the switch 115 is open (e.g., when the inductor 102 is not mutually coupled to the inductor 114). A position of the switch 115 may therefore selectively enable a mutual coupling of the inductor 102 and the inductor 114 and may vary an impedance presented by the inductor 102 (and thus presented by the signal path 130). Thus, the inductor 114 (e.g., in conjunction with the switch 115) may be configured to vary an effective impedance of the matching network 100 (e.g., by varying an impedance presented by the inductor 102 and thus the impedance along the signal path 130) by selective mutual coupling between the inductor 102 and the inductor 114.

The switch 117 may open or close responsive to a control signal 123 and may be configured to selectively enable mutual coupling of the inductor 124 and the inductor 104. For example, when the switch 117 is closed, current may be allowed to flow along the switched inductor circuit 105 (e.g., through the inductor 124), enabling mutual coupling of the inductor 124 and the inductor 104. Alternatively, when the switch 117 is open, current may not be allowed to flow along the switched inductor circuit 105 (e.g., through the inductor 124), thereby preventing mutual coupling of the inductor 124 and the inductor 104.

Operation of the switch 117 affects an effective impedance of the inductor 104 by increasing or increasing a mutual inductance due to the inductor 124. In this example, an impedance of the signal path 130 may have a first value when the inductor 124 is mutually coupled to the inductor 104 and may have a second value when the inductor 124 is not mutually coupled to the inductor 104. For example, an impedance presented by the inductor 124 may be mathematically described by Equation 4, where $L_3$ corresponds to a self-inductance of the inductor 104, $L_4$ corresponds to a self-inductance of the inductor 124, $M_{104,124}$ corresponds to a mutual inductance of the inductor 104 and the inductor 124, and $R_{117}$ corresponds to a resistance presented by the switch 117.

$$Z_{104} = j\omega L_3 - j\omega L_4 \frac{\omega^2 M_{104,124}^2}{R_{117}^2 + \omega^2 L_4^2} + \frac{\omega^2 M_{104,124}^2}{R_{117}^2 + \omega^2 L_4^2} R_{117} \quad \text{Equation (4)}$$

When the switch 117 is closed (e.g., when the switch 117 is in a first configuration), the resistance $R_{117}$ (of Equation 4) presented by the switch 117 may be approximated as zero ohms and the inductor 104 is mutually coupled to the inductor 124 (e.g., the mutual inductance $M_{104,124}$ of Equation 4 is non-zero). Thus, when the switch 117 is closed, Equation 4 mathematically reduces to Equation 5, which mathematically describes the impedance $Z_{104\_closed}$ presented by the inductor 104 when the switch 117 is closed. Thus, when the switch 117 is closed, the impedance $Z_{104\_closed}$ presented by the inductor 104 is based on the self-inductance $L_3$ of the inductor 104, the self-inductance $L_4$ of the inductor 124, and the mutual inductance $M_{104,124}$ of the inductor 104 and the inductor 124.

$$Z_{104\_closed} = j\omega L_3 - j\omega L_4 \frac{M_{104,124}^2}{L_4^2} \quad \text{Equation (5)}$$

When the switch 117 is open (e.g., when the switch 117 is in a second configuration), the resistance $R_{117}$ (of Equation 1) presented by the switch 117 may be approximated as infinity and the inductor 104 is not mutually coupled to the inductor 124 (e.g., the mutual inductance $M_{104,124}$ of Equation 4 corresponds to zero). Thus, when the switch 117 is open, Equation 4 mathematically reduces to Equation 6, which mathematically describes the impedance $Z_{104\_open}$ when the switch 117 is open. Thus, when the switch 117 is open, the impedance $Z_{104\_open}$ presented by the inductor 104 may be based on the self-inductance $L_1$ of the inductor 104.

$$Z_{104\_open} = j\omega L_1 \quad \text{Equation (6)}$$

Equations 4-6 demonstrate that an inductance $Z_{104\_closed}$ presented by the inductor 104 when the switch 117 is closed (e.g., when the inductor 104 is mutually coupled to the inductor 124) may be different than an inductance $Z_{104\_open}$ presented the inductor 104 when the switch 117 is open (e.g., when the inductor 104 is not mutually coupled to the inductor 124). A position of the switch 117 may therefore selectively enable a mutual coupling of the inductor 104 and the inductor 124 and may vary an impedance presented by the inductor 104 (and thus presented by the signal path 130). Thus, the inductor 124 (e.g., in conjunction with the switch 117) may be configured to vary an effective impedance of the matching network 100 (e.g., by varying an impedance presented by the inductor 104 and thus the impedance along the signal path 130) by selective mutual coupling between the inductor 104 and the inductor 124.

Varying the impedance or reactance of the matching network 100 by varying the inductance of the signal path 130 (e.g., by varying the impedance presented by the inductor 102, the inductor 104, or both) may enable the matching network 100 to be tuned for impedance matching at different frequencies. For example, the signal path 130 may present a first effective impedance when the inductor 102 and the inductor 104 are mutually coupled to corresponding second inductors (e.g., when the switch 115 and the switch 117 are closed). The first impedance may be effective for impedance matching signals at a first frequency (or frequency band). The signal path 130 may present a second impedance when the inductor 102 is mutually coupled to a corresponding second inductor and the inductor 104 is not mutually coupled to a corresponding second inductor (e.g., when the switch 115 is closed and the switch 117 is open). The second impedance may be effective for impedance matching signals at a second frequency (or frequency band). The signal path 130 may present a third impedance when the inductor 102 is not mutually coupled to a corresponding second inductor and the inductor 104 is mutually coupled to a corresponding second inductor (e.g., when the switch 115 is open and the switch 117 is closed). The third impedance may be effective for impedance matching signals at a third frequency (or frequency band). The signal path 130 may present a fourth impedance when the inductor 102 and the inductor 104 are not mutually coupled to corresponding second inductors (e.g., when the switch 115 and the switch 117 are open). The fourth impedance may be effective for impedance matching signals at a fourth frequency (or frequency band). Thus, selectively controlling a mutual coupling between the inductor 114 and the inductor 102 using the switch 115, selectively controlling a mutual coupling between the inductor 124 and the inductor 104 using the switch 117, or both, may enable the matching network 100 to be tuned for impedance matching at different frequencies.

Although the switched inductor circuits 103 and 105 (including the at least one second inductor) are described above as being disposed outside of the signal path, in other examples, one or more of the switched inductor circuits 103 or 105 may be located in a signal path of the matching network 100.

Referring to FIG. 2A, a particular illustrative example of a switched inductor circuit 200 having multiple switches (e.g., a plurality of switches) and a plurality of inductors that are outside of a signal path (e.g., the signal path 130 of FIG. 1) of a matching network (e.g., the matching network 100 of FIG. 1) and that are in a first particular configuration is illustrated. In the first particular configuration of the switched inductor circuit 200 of FIG. 2A, two of the plurality of inductors (but not all of the plurality of inductors) of the switched inductor circuit 200 are mutually coupled to at least one first inductor 222 that is in a signal path (e.g., the signal path 130 of FIG. 1) of the matching network (e.g., the matching network 100 of FIG. 1). The switched inductor circuit 200 may correspond to the switched inductor circuit 103 or to the switched inductor circuit 105 of FIG. 1. The at least one first inductor 222 may correspond to the inductor 102 or to the inductor 104 of FIG. 1.

The plurality of switches include switches 201, 202, 203, 204, 205, 206, 207, 208, 209, 210, 211, and 212. The plurality of inductors include inductors 214, 216, and 218. The switches 201, 202, 203, 204, 205, 206, 207, 208, 209, 210, 211, and 212 are configured to couple any node of any of the plurality of inductors 214, 216, and 218 to any other node of the plurality of inductors 214, 216, and 218. The plurality of switches 201, 202, 203, 204, 205, 206, 207, 208, 209, 210, 211, and 212 are responsive to a control signal 221. Although the plurality of switches 201, 202, 203, 204, 205, 206, 207, 208, 209, 210, 211, and 212 are illustrated as being single-way switches, multi-way switches may be used. Additionally, in some aspects or examples, the plurality of switches form a switch matrix configured to enable coupling of any node of any of the plurality of inductors 214, 216, and 218 to any other node of the plurality of inductors 214, 216, and 218.

In the first particular configuration of the switched inductor circuit 200 of FIG. 2A, the inductors 214 and 216 are electrically coupled to each other when the switches 211 and 212 are closed and the remaining switches (e.g., the switches 201, 202, 203, 204, 205, 206, 207, 208, 209, and 210) are open (e.g., responsive to the control signal 221). Closing the switches 211 and 212 while leaving the remaining switches open provides a current path (indicated by the bolded lines) for current (induced via inductive coupling with the at least one first inductor 222) to flow, enabling mutual coupling of the inductors 214 and 216 with the at least one first inductor 222. In contrast, leaving the switches 201, 202, 203, 204, 205, 206, 207, 208, 209, and 210 open electrically isolates the inductor 218, preventing a current path through the inductor 218, thereby preventing mutual coupling of the inductor 218 and the at least one first inductor 222. The plurality of switches therefore enable mutual coupling of the at least one first inductor 222 and one or more first inductors (e.g., the inductors 214 and 216) of the plurality of inductors 214, 216, and 218 when the plurality of switches are in a first configuration. Thus, when the switched inductor circuit 200 has the first particular configuration of FIG. 2A, the at least one first inductor 222 presents a first impedance that is based on a mutual inductance of the inductor 214 and the at least one first inductor 222 and on a mutual inductance of the inductor 216 and the at least one first inductor 222, but not on a mutual inductance of the inductor 218 and the at least one first inductor 222.

Referring to FIG. 2B, a particular illustrative example of the switched inductor circuit 200 of FIG. 2A having a plurality of switches and a plurality of inductors that are outside of a signal path (e.g., the signal path 130 of FIG. 1) of a matching network (e.g., the matching network 100 of FIG. 1) and that are in a second particular configuration is illustrated. In the second particular configuration of FIG. 2B, different inductors (e.g., one or more second inductors 216 and 218) of the plurality of inductors 214, 216, and 218) of the switched inductor circuit 200 are mutually coupled to the at least one first inductor 222 than the inductors of the switched inductor circuit 200 (e.g., the one or more first inductors 214 and 216 of the plurality of inductors 214, 216, and 218) that are mutually coupled to the at least one first inductor 222 in the first particular configuration of FIG. 2A.

In the second particular configuration of FIG. 2B, the inductors 216 and 218 are electrically coupled when the switches 205 and 208 are closed and the remaining switches (e.g., the switches 201, 202, 203, 204, 206, 207, 209, 210, 211, and 212) are open (e.g., responsive to the control signal 221). Closing the switches 205 and 208 while leaving the remaining switches open provides a current path (indicated by the bolded lines) for current (induced via inductive coupling with the at least one first inductor 222) to flow, enabling mutual coupling of the inductors 216 and 218 with the at least one first inductor 222. In contrast, leaving the switches 201, 202, 203, 204, 206, 207, 209, 210, 211, and 212 open electrically isolates the inductor 214, preventing a current path through the inductor 214, and thereby preventing mutual coupling of the inductor 214 and the at least one first inductor 222. The plurality of switches therefore enable mutual coupling of the at least one first inductor 222 and one or more second inductors (e.g., the inductors 216 and 218) of the plurality of inductors 214, 216, and 218 when the plurality of switches are in the second particular configuration. Thus, in this example, the at least one first inductor 222 may present a second impedance that is based on a mutual inductance of the inductor 216 and the at least one first inductor 222 and on a mutual inductance of the inductor 218 and the at least one first inductor 222, but not on a mutual inductance of the inductor 214 and the at least one first inductor 222.

Thus, the effective impedance presented by the at least one first inductor 222 when the switched inductor circuit 200 has the first particular configuration of FIG. 2A (e.g., the first impedance) is different than the effective impedance presented by the at least one first inductor 222 when the switched inductor circuit 200 has the second particular configuration of FIG. 2B (e.g., the second impedance). The first particular configuration of FIG. 2A may therefore be used for impedance matching at a different frequency than the second particular configuration of FIG. 2B.

Referring to FIG. 2C, a particular illustrative example of the switched inductor circuit 200 of FIG. 2A in a third particular configuration is illustrated. In the third particular configuration of FIG. 2C, the same inductors of the switched inductor circuit 200 (e.g., the one or more first inductors 214 and 216 of the plurality of inductors 214, 216, and 218) as the inductors of the switched inductor circuit 200 of FIG. 2A are mutually coupled to the first inductor 222. However, the one or more first inductors 214 and 216 of the plurality of inductors 214, 216, and 218 are electrically coupled in a different electrical configuration in the first particular configuration of FIG. 2A than in the third particular configuration of FIG. 2C.

In the third particular configuration of FIG. 2C, the one or more first inductors 214 and 216 are electrically coupled when the switches 201 and 202 are closed and the remaining switches (e.g., the switches 203, 204, 205, 206, 207, 208, 209, 210, 211, and 212) are open (responsive to the control signal 221). Closing the switches 201 and 202 while leaving the remaining switches open provides a current path (indicated by the bolded lines) for current (induced via inductive coupling with the at least one first inductor 222) to flow, enabling mutual coupling of the inductors 214 and 216 with the at least one first inductor 222. In contrast, leaving the switches 203, 204, 205, 206, 207, 208, 209, 210, 211, and 212 open electrically isolates the inductor 218, preventing a current path through the inductor 218, and thereby preventing mutual coupling of the inductor 214 and the at least one first inductor 222.

In this example, the at least one first inductor 222 may present a third effective impedance that is based on a mutual inductance of the inductor 214 and the at least one first inductor 222 and a mutual inductance of the inductor 216 and the at least one first inductor 222, but not on a mutual inductance of the inductor 218 and the at least one first inductor 222. Thus, the one or more switches 201, 202, 203, 204, 205, 206, 207, 208, 209, 210, 211, and 212 may be configured to enable mutual coupling of the at least one first inductor 222 and at least two second inductors (e.g., the one or more first inductors 214 and 216) when the one or more switches 201, 202, 203, 204, 205, 206, 207, 208, 209, 210, 211, and 212 are in a first configuration (e.g., the first particular configuration of FIG. 2A) and are in a second configuration (e.g., the third particular configuration of FIG.

2C). The at least two second inductors are in a first electrical configuration when the one or more switches 201, 202, 203, 204, 205, 206, 207, 208, 209, 210, 211, and 212 are in the first configuration (e.g., of FIG. 2A) and are in a second electrical configuration (e.g., that is different than the first electrical configuration) when the one or more switches 201, 202, 203, 204, 205, 206, 207, 208, 209, 210, 211, and 212 are in the second configuration (e.g., of FIG. 2C). Due to the different electrical configuration of the one or more first inductors 214 and 216 in the first particular configuration of FIG. 2A and the second configuration (e.g., the third particular configuration) of FIG. 2C, the first effective impedance may be different than the third effective impedance. The first particular configuration of FIG. 2A may therefore be used for impedance matching at a different frequency than the third particular configuration of FIG. 2C.

Figure 3:
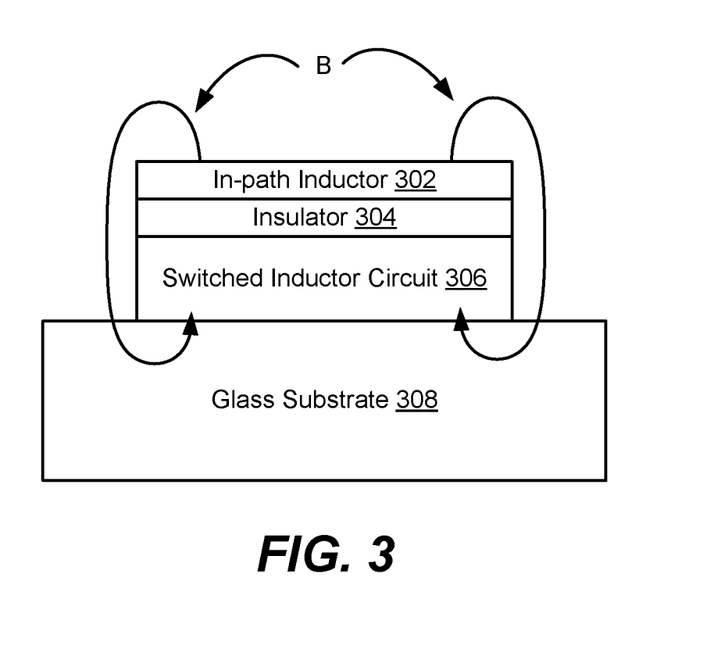
FIG. 3 is a particular illustrative example of a switched inductor circuit that is disposed outside of a signal path of a matching network and that includes passive on glass components.

Referring to FIG. 3, a particular illustrative example of a device including a switched inductor circuit 306 and an in-path inductor 302 (for a matching network) formed using passive-on-glass components is illustrated and generally designated 300. The matching network may correspond to the matching network 100 of FIG. 1. The switched inductor circuit 306 may correspond to the switched inductor circuit 103 or 105 of FIG. 1 or to the switched inductor circuit 200 of FIG. 2A, 2B, or 2C. The in-path inductor 302 may correspond to the inductor 102 or 104 of FIG. 1 or to the first inductor 222 of FIG. 2A, 2B, or 2C.

The device 300 includes a glass substrate 308. One or more components of the switched inductor circuit 306 may be formed proximate to (e.g., on, above, or over) the glass substrate. For example, the inductor 114 or the inductor 124 of FIG. 1 may be formed proximate to the glass substrate 308. As another example, one or more of the inductors 214, 216, or 218 may be formed proximate to the glass substrate 308. In these examples, one or more inductors of the switched inductor circuit 306 may be formed in one or more layers proximate to the glass substrate 308.

Figure 4:
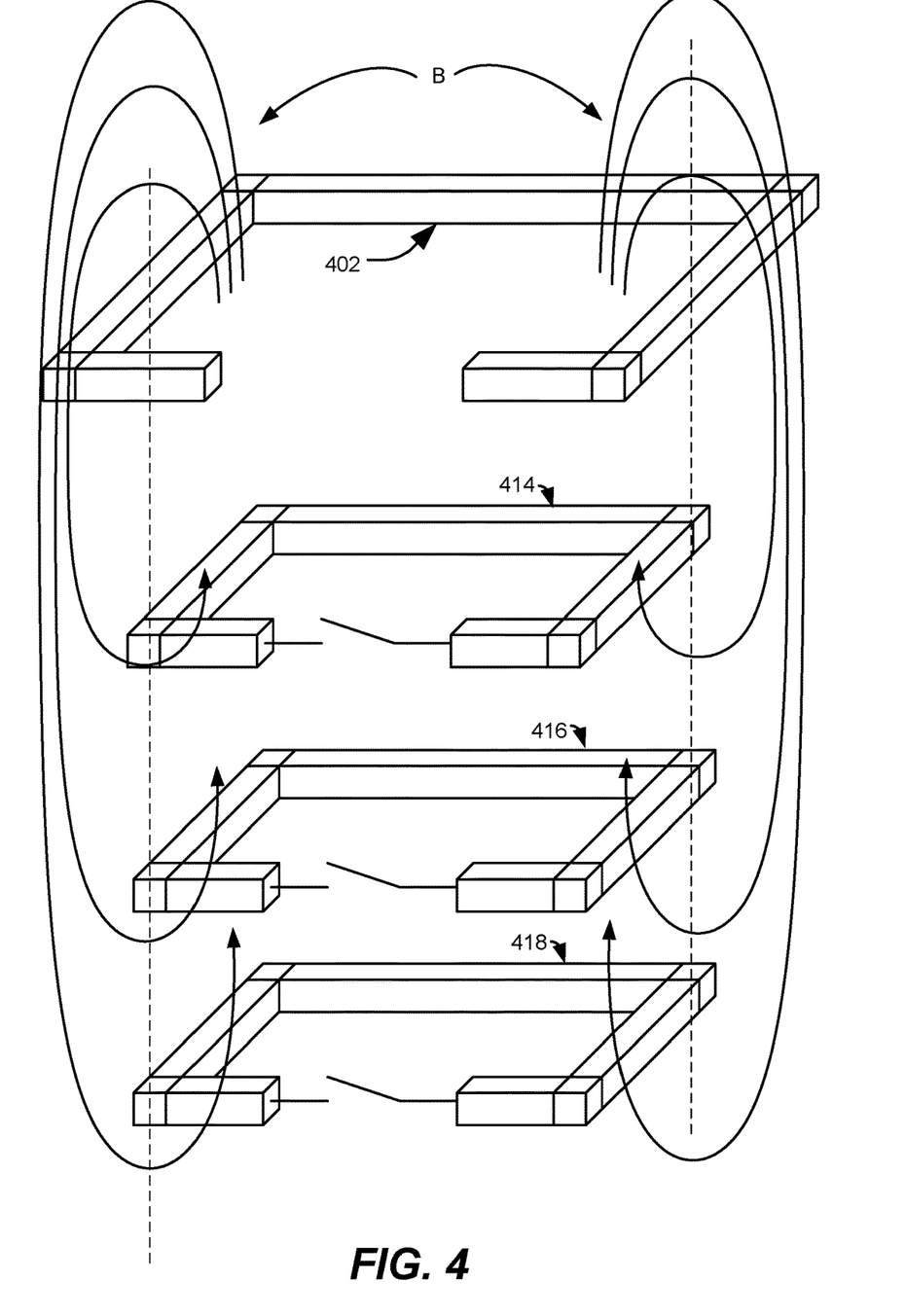
FIG. 4 is an unassembled view of a particular illustrative example of three ringed auxiliary inductors to be disposed outside of a signal path of a matching network and a ringed primary inductor to be disposed in the signal path of the matching network.

In some examples, one or more inductors of the switched inductor circuit 306 include ringed inductors. As an example, FIG. 4 illustrates an unassembled perspective view of ringed auxiliary inductors 414, 416, and 418 to be stacked proximate to (e.g., under) an in-path inductor (e.g., the inductor 102 or 104 of FIG. 1; the at least one first inductor 222 of FIG. 2A, 2B, or 2C; or the in-path inductor 302 of FIG. 3). The ringed auxiliary inductors 414, 416, and 418 may correspond to the inductors 214, 216, and 218 of FIG. 2A, 2B, or 2C, respectively. Each of the ringed auxiliary inductors 414, 416, and 418 may be formed in a layer on, above, or over, the glass substrate 308 of FIG. 3.

The one or more inductors of the switched inductor circuit may be formed such that magnetic flux ("B") from the in-path inductor 302 is incident on one or more inductors of the switched inductor circuit 306 that are switched to be mutually coupled to the in-path inductor 302 as described above with reference to FIG. 1, 2A, 2B, or 2C. Thus, the auxiliary inductors of the switched inductor circuit 306 may be passive on glass components.

Figure 5:
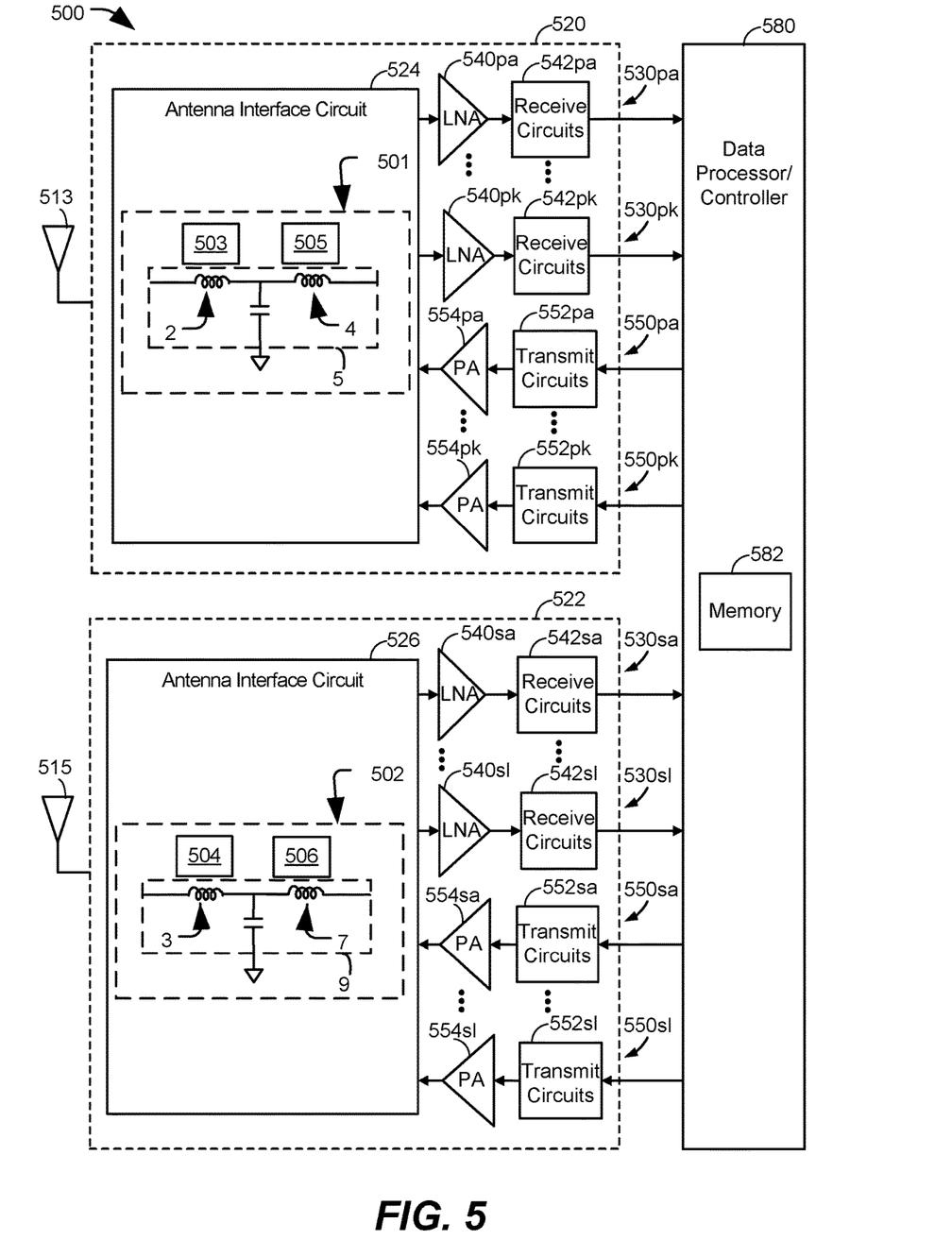
FIG. 5 is an example of a wireless device that includes a matching network that includes one or more auxiliary inductors outside of a signal path of the matching network and one or more primary inductors in the signal path of the matching network.

FIG. 5 shows a block diagram of an exemplary design of a wireless device 500. In this exemplary design, the wireless device 500 includes a transceiver 520 coupled to a primary antenna 513, a transceiver 522 coupled to a secondary antenna 515, and a data processor/controller 580. The transceiver 520 includes multiple (K) receivers 530*pa* to 530*pk* and multiple (K) transmitters 550*pa* to 550*pk* to support multiple frequency bands, multiple radio technologies, carrier aggregation, receive diversity, multiple-input multiple-output (MIMO) transmission from multiple transmit antennas to multiple receive antennas, etc. The transceiver 522 includes multiple (L) receivers 530*sa* to 530*sl* and multiple (L) transmitters 550*sa* to 550*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 5, each transmitter 550*pa*-550*pk* and 550*sa*-550*sl* includes a transmit circuit 552*pa*-552*pk* and 552*sa*-552*sl* and a power amplifier (PA) 554*pa*-554*pk* and 554*sa*-554*sl*, respectively. For data transmission, data processor 580 processes (e.g., encodes and modulates) data to be transmitted and provides an analog output signal to a selected transmitter. For example, the transmitter 550*pa* may be the selected transmitter. Within transmitter 550*pa*, transmit circuits 552*pa* amplify, filter, and upconvert the analog output signal from baseband to radio frequency (RF) and provide a modulated RF signal. Transmit circuits 552*pa* may include amplifiers, filters, mixers, matching circuits, an oscillator, a local oscillator (LO) generator, a phase-locked loop (PLL), etc. A power amplifier 554*pa* receives and amplifies the modulated RF signal and provides a transmit RF signal having an output power level that is satisfactory for wireless transmission. The transmit RF signal is routed through antenna interface circuit 524 and transmitted via antenna 513. Each remaining transmitter 550*pk* and 550*sa*-550*sl* in transceivers 520 and 522 may operate in a similar manner as the transmitter 550*pa*. For example, the power amplifier 554*sa* may receive and amplify a modulated RF signal from the transmit circuits 552*sa* and may provide a transmit RF signal having an output power level that is satisfactory for wireless transmission. The transmit RF signal is routed through antenna interface circuit 526 and transmitted via antenna 515.

The antenna interface circuit 524 may include a matching network 501. The matching network 501 may correspond to or may operate as described above with respect to FIG. 1, 2A, 2B, or 2C. For example, the matching network 501 may include inductors 2 and 4 that may correspond to the inductors 102 and 104 of FIG. 1. The matching network 501 may include a switched inductor circuit 503 or 505. The switched inductor circuits 503 or 505 may correspond to or may operate as described above with respect to the switched inductor circuits 103 and 105 of FIG. 1 or the switched inductor circuit 200 of FIG. 2A, 2B, or 2C. The switched inductor circuits 503 and 505 may be configured to vary an effective impedance of the signal path 5, enabling the matching network 501 to be tuned for impedance matching at different frequencies.

Alternatively or additionally, the antenna interface circuit 526 may include a matching network 502. The matching network 502 may correspond to or may operate as described above with respect to FIG. 1, 2A, 2B, or 2C. For example, the matching network 502 may include inductors 3 and 7 that may correspond to the inductors 102 and 104 of FIG. 1. The matching network 502 may include a switched inductor circuit 504 or 506. The switched inductor circuits 504 or 506 may correspond to or may operate as described above with respect to the switched inductor circuits 103 and 105 of FIG. 1 or the switched inductor circuit 200 of FIG. 2A, 2B, or 2C. The switched inductor circuits 504 and 506 may be configured to vary an effective impedance of the signal path 9, enabling the matching network 502 to be tuned for impedance matching at different frequencies.

In the exemplary design shown in FIG. 5, each receiver 530*pa*-530*pk* and 530*sa*-530*sl* includes an LNA 540*pa*-540*pk* and 540*sa*-540*sl* and a receive circuit 542*pa*-542*pk* and 542*sa*-542*sl*, respectively. For data reception, antenna 513 receives signals from base stations and/or other transmitter stations and provides a received RF signal, which is routed through an antenna interface circuit 524 and presented as an input RF signal to a selected receiver. Antenna interface circuit 524 may include switches, duplexers, transmit filters, receive filters, matching circuits, etc. The description below assumes that receiver 530*pk* is the selected receiver. Within receiver 530*pk*, an LNA 540*pk* amplifies the input RF signal and provides an output RF signal. The LNA 540*pk* may be configured to amplify the received signal to generate an amplified signal.

Receive circuits 542*pk* down-convert the in-phase signals and the quadrature signals to baseband, amplify and filter the downconverted signal, filter the close-in frequency jammer, and provide an analog input signal to data processor 580. Receive circuits 542*pk* may include mixers, filters, amplifiers, matching circuits, an oscillator, a local oscillator (LO) generator, a phase locked loop (PLL), etc. Each remaining receiver 530*pa* and 530*sa*-530*sl* in transceivers 520 and 522 may operate in a similar manner as the receiver 530*pk*.

A receiver and a transmitter may also include other circuits not shown in FIG. 5, such as filters, matching circuits, etc. All or a portion of the transceivers 520 and 522 may be implemented on one or more analog integrated circuits (ICs), RF ICs (RFICs), mixed-signal ICs, etc. For example, LNAs 540*pa*-540*pk* and 540*sa*-540*sk* and receive circuits 542*pa*-542*pk* and 542*sa*-542*sk* may be implemented in one manner, which may be an RFIC, etc. The circuits in transceivers 520 and 522 may also be implemented in other manners.

Data processor/controller 580 may perform various functions for wireless device 500. For example, data processor 580 may perform processing for data being received via the receivers 530*pa*-530*pk* and 530*sa*-530*sl* and data being transmitted via transmitters 550*pa*-550*pk* and 550*sa*-550*sl*. Data processor/controller 580 may control the operation of the various circuits within transceivers 520 and 522. A memory 582 may store program code and data for the data processor/controller 580. Data processor/controller 580 may be implemented in one or more application specific integrated circuits (ASICs) and/or other ICs.

Wireless device 500 may support multiple frequency band groups, multiple radio technologies, and/or multiple antennas. Wireless device 500 may include a number of LNAs to support reception via the multiple frequency band groups, multiple radio technologies, and/or multiple antennas.

Figure 6:
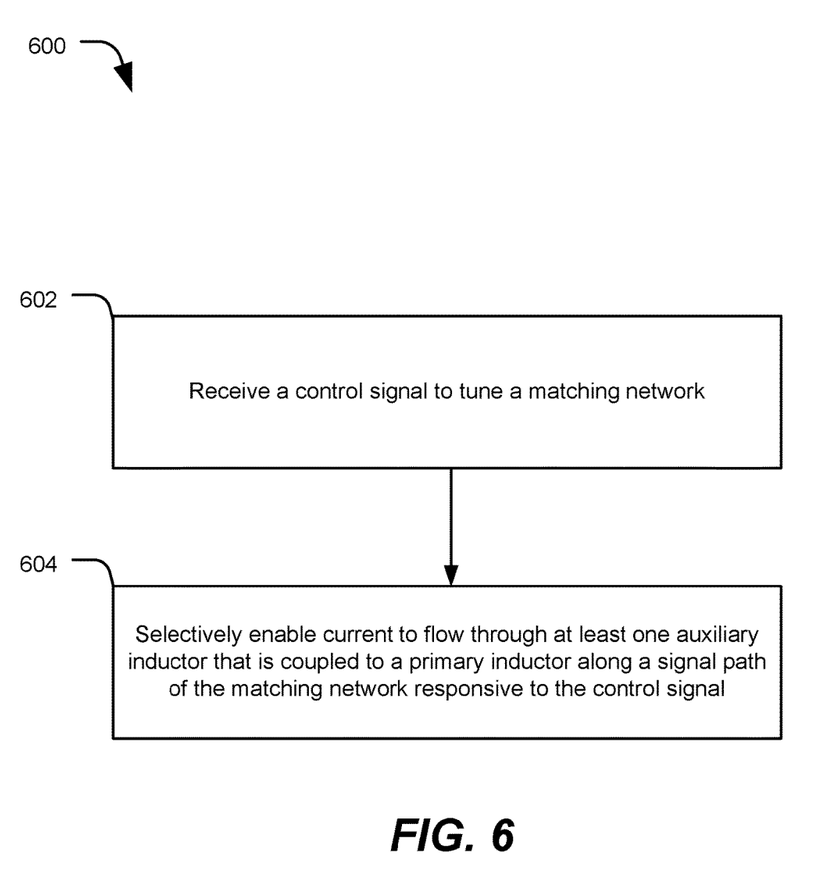
FIG. 6 is an example of a method for tuning a matching network using one or more switched inductor circuits disposed outside of the signal path of the matching network.

Referring to FIG. 6, a flow chart of an illustrative example of a method 600 of tuning a matching network is depicted. In an illustrative example, the method may be performed using the matching network of FIG. 1 or the switched inductor circuit 200 of FIG. 2A, 2B, or 2C.

The method 600 includes, at 602, receiving a control signal (e.g., a first control signal) to tune a matching network (e.g., based on a first frequency). The first control signal may correspond to a particular value of the control signal 121, the control signal 123, or both, of FIG. 1, or may correspond to a particular value of the control signal 221 of FIG. 2A, 2B, or 2C.

For example, the control signal may correspond to the control signal 121 of FIG. 1 that controls whether the switch 115 is open or closed, and therefore whether the inductor 102 presents the first or second effective impedance described above with reference to FIG. 1. As another example, the control signal may correspond to the control signal 123 of FIG. 1 that controls whether the switch 117 is open or closed, and therefore whether the inductor 104 presents the first or second effective impedance described above with reference to FIG. 1.

As another example, the control signal may correspond to the control signal 221 of FIG. 2A, 2B, or 2C that controls whether the switches 201, 202, 203, 204, 205, 206, 207, 208, 209, 210, 211, and 212 are open or closed, and therefore controls which one or more of the inductors 214, 216, or 218 is mutually coupled to the at least one first inductor 222 and how the inductors 214, 216, and 218 are electrically connected to each other as described above with reference to FIG. 2A, 2B, or 2C. Thus, the control signal may control whether the at least one first inductor 222 of FIG. 2A, 2B, or 2C presents the first effective impedance, the second effective impedance, or the third effective impedance as described above with reference to FIG. 2A, 2B, or 2C.

The method 600 further includes, at 604, selectively enabling, responsive to the control signal, current to flow through at least one auxiliary inductor that is coupled to a primary inductor along a signal path of the matching network. The auxiliary inductor may correspond to one or more inductors in a switched inductor circuit, such as the switched inductor circuit 103 or 105 of FIG. 1 or the switched inductor circuit 200 of FIG. 2A, 2B, or 2C. The primary inductor may correspond to the inductor 102 or 104 of FIG. 1 or the at least one first inductor 222 of FIG. 2A, 2B, or 2C. The signal path may correspond to the signal path 130 of FIG. 1 or to the signal path 5 or the signal path 9 of FIG. 5.

For example, the at least one auxiliary inductor may correspond to the inductor 114 of FIG. 1 and current flow through the inductor 114 may be selectively enabled or disabled (responsive to the first control signal 121) based on a position of the switch 115 as described above with reference to FIG. 1. In some examples, selectively enabling current to flow through the inductor 114 includes configuring one or more switches (e.g., the switch 115) in the first configuration described above with reference to FIG. 1 responsive to a first value of the control signal 121. Enabling current to flow through the inductor 114 may mutually couple the inductor 114 to the inductor 102 (while disabling or preventing current flow through the inductor 114 may prevent the inductor 114 from mutually coupling to the inductor 102). The inductor 102 (and therefore the signal path 130) may present the first impedance described above with reference to FIG. 1 when the inductor 102 is mutually coupled to the inductor 114 (e.g., when the switch 115 is in the first configuration) and may present the second impedance described above with reference to FIG. 1 when the inductor 102 is not mutually coupled to the inductor 114 (e.g., when the switch 115 is in the second configuration described above with reference to FIG. 1). Thus, the matching network 100 may be tuned for matching at a first frequency when current through the inductor 114 is enabled (e.g., when the switch 115 is in the first configuration) and may be tuned for matching at a second frequency when current through the inductor 114 is disabled (e.g., when the switch 115 is in a second configuration).

As another example, the at least one auxiliary inductor may correspond to the inductor 124 of FIG. 1 and current flow through the inductor 124 may be selectively enabled or disabled (responsive to the control signal 123) based on a position of the switch 117 as described above with reference to FIG. 1. In some examples, selectively enabling current to flow through the inductor 124 includes configuring one or more switches (e.g., the switch 117) in the first configuration described above with reference to FIG. 1 responsive to a first value of the control signal 123. Enabling current to flow through the inductor 124 may mutually couple the inductor 124 to the inductor 104 (while disabling or preventing current flow through the inductor 124 may prevent the inductor 124 from mutually coupling to the inductor 104). The inductor 104 (and therefore the signal path 130) may present a different impedance when the inductor 104 is mutually coupled to the inductor 124 (e.g., when the switch 117 is in the first configuration described above with reference to FIG. 1) than when the inductor 104 is not mutually coupled to the inductor 124 (e.g., when the switch 117 is in the second configuration described above with reference to FIG. 1). Thus, the matching network 100 may be tuned for matching at a first frequency when current through the inductor 124 is enabled (e.g., when the switch 117 is in the first configuration) and may be tuned for matching at a second frequency when current through the inductor 124 is disabled (e.g., when the switch 117 is in the second configuration).

As another example, the at least one auxiliary inductor may correspond to the plurality of inductors 214, 216, and 218 as described above with reference to FIG. 2A, 2B, or 2C. Current flow through the plurality of inductors 214, 216, or 218 may be selectively enabled or disabled (responsive to the control signal 221) based on a position of the switches 201, 202, 203, 204, 205, 206, 207, 208, 209, 210, 211, and 212 as described above with reference to FIG. 2A, 2B, or 2C. In some examples, selectively enabling current to flow through the plurality of inductors 214, 216, and 218 includes configuring one or more switches (e.g., the plurality of switches 201, 202, 203, 204, 205, 206, 207, 208, 209, 210, 211, and 212) in a first configuration responsive to the first control signal. For example, the first configuration may correspond to the first particular configuration described above with reference to FIG. 2A, in which case current is enabled to flow through the one or more first inductors 214 and 216, but not through the inductor 218.

Enabling current to flow through the one or more first inductors 214 and 216 may mutually couple the one or more first inductors 214 and 216 to the at least one first inductor 222 (while disabling or preventing current flow through the inductor 218 may prevent the inductor 218 from mutually coupling to the at least one first inductor 222). Thus, the one or more first inductors 214 and 216 of the plurality of second inductors 214, 216, and 218 are mutually coupled to the at least one first inductor 222 when the plurality of switches 201, 202, 203, 204, 205, 206, 207, 208, 209, 210, 211, and 212 are in the first configuration. The at least one first inductor 222 may present a first impedance when the one or more first inductors 214 and 216 of the plurality of inductors 214, 216, and 218 are mutually coupled to the at least one first inductor 222. Thus, the matching network 100 may be tuned for matching at a first frequency when the plurality of switches 201, 202, 203, 204, 205, 206, 207, 208, 209, 210, 211, and 212 are in the first configuration.

The method 600 may further include receiving a second control signal to tune the matching network (e.g., the matching network 100 of FIG. 1) based on a second frequency (e.g., that is different than the first frequency). The second control signal may correspond to a second value of the control signal 121 of FIG. 1, the control signal 123 of FIG. 1, or the control signal 221 of FIG. 2A, 2B, or 2C.

The method 600 may further include configuring the one or more switches in a second configuration responsive to the second control signal. For example, the at least one auxiliary inductor may correspond to the inductor 114 of FIG. 1 and configuring the one or more switches in a second configuration includes configuring the switch 115 in the second configuration described above with reference to FIG. 1. In the second configuration, current is disabled or prevented from flowing through the inductor 114. Disabling or preventing current from flowing through the inductor 114 prevents the inductor 114 from mutually coupling to the inductor 102. The inductor 102 (and therefore the signal path 130) may present the second impedance described above with reference to FIG. 1 when the inductor 102 is not mutually coupled to the inductor 114 (e.g., when the switch 115 is in the second configuration described above with reference to FIG. 1). Thus, the matching network 100 may be tuned for matching at a second frequency when current flow through the inductor 114 is disabled (e.g., when the switch 115 is in the second configuration).

As another example, the at least one auxiliary inductor may correspond to the inductor 124 of FIG. 1 and configuring the one or more switches in a second configuration includes configuring the switch 117 in the second configuration described above with reference to FIG. 1. In the second configuration, current is disabled or prevented from flowing through the inductor 124. Disabling or preventing current from flowing through the inductor 124 prevents the inductor 124 from mutually coupling to the inductor 104. The inductor 104 (and therefore the signal path 130) may present the second impedance described above with reference to FIG. 1 when the inductor 104 is not mutually coupled to the inductor 124 (e.g., when the switch 117 is in the second configuration described above with reference to FIG. 1). Thus, the matching network 100 may be tuned for matching at a second frequency when current flow through the inductor 124 is disabled (e.g., when the switch 117 is in the second configuration).

As another example, the at least one auxiliary inductor may correspond to the plurality of inductors 214, 216, and 218 as described above with reference to FIG. 2A, 2B, or 2C and configuring the one or more switches in a second configuration includes configuring the switches 201, 202, 203, 204, 205, 206, 207, 208, 209, 210, 211, and 212 in the second particular configuration of FIG. 2B. In the second particular configuration of FIG. 2B, current is enabled to flow through the one or more second inductors 216 and 218, but not through the inductor 214.

Enabling current to flow through the one or more second inductors 216 and 218 may mutually couple the one or more second inductors 216 and 218 to the at least one first inductor 222. Thus, the one or more second inductors 216 and 218 of the plurality of inductors 14, 216, and 218 may be mutually coupled to the at least one first inductor 222 when the switches 201, 202, 203, 204, 205, 206, 207, 208, 209, 210, 211, and 212 are in the second particular configuration of FIG. 2B. The at least one first inductor 222 may present a second impedance (that is different than the first impedance) when the one or more second inductors 216 and 218 of the plurality of inductors 214, 216, and 218 are mutually coupled to the at least one first inductor 222. Thus, the matching network 100 may be tuned for matching at a second frequency that is different than the first frequency when the plurality of inductors 214, 216, and 218 are in the second configuration as opposed to in the first configuration.

In conjunction with the described examples, a system is disclosed that may include first means for providing electromagnetic induction disposed in a signal path of a matching network. For example, the first means for providing electromagnetic induction may correspond to the inductor 102 of FIG. 1, the inductor 104 of FIG. 1, or the at least one first inductor 222 of FIG. 2A, 2B, or 2C. The system also includes second means for providing electromagnetic induction disposed outside of the signal path. For example, the second means for providing electromagnetic induction may correspond to the inductor 114 of FIG. 1; the inductor 124 of FIG. 1; or one or more of the inductors 214, 216, or 218 of FIG. 2A, 2B, or 2C. The system also includes means for switching coupled to the second means for providing electromagnetic induction. For example, the means for switching may correspond to the switch 115 of FIG. 1; the switch 117 of FIG. 1; or one or more of the switches 201, 202, 203, 204, 205, 206, 207, 208, 209, 210, 211, and 212 of FIG. 2A, 2B, or 2C. The means for switching is configured to selectively enable mutual coupling of the first means for providing electromagnetic induction and the second means for providing electromagnetic induction as described above with reference to FIG. 1 or FIG. 2A, 2B, or 2C.

Although one or more of FIGS. 1-6 may illustrate systems, devices, and/or methods according to the teachings of the disclosure, the disclosure is not limited to these illustrated systems, devices, and/or methods. Aspects of the disclosure may be suitably employed in any device that includes integrated circuitry including memory, a processor, and on-chip circuitry.

One or more functions or components of any of FIGS. 1-6 as illustrated or described herein may be combined with one or more other portions of another of FIGS. 1-6. Accordingly, no single aspect or example described herein should be construed as limiting and aspects or examples of the disclosure may be suitably combined without departing form the teachings of the disclosure.

Those of skill would further appreciate that the various illustrative logical blocks, configurations, modules, circuits, and algorithm steps described in connection with the aspects or examples disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects or examples disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A storage device is not a signal.

The previous description of the disclosed aspects or examples is provided to enable a person skilled in the art to make or use the disclosed aspects or examples. Various modifications to these aspects or examples will be readily apparent to those skilled in the art, and the principles defined herein may be applied to other aspects or examples without departing from the scope of the disclosure. Thus, the present disclosure is not intended to be limited to the aspects or examples shown herein but is to be accorded the widest scope possible consistent with the principles and novel features as defined by the following claims.

What is claimed is:

1. A device comprising:
   at least one first inductor in a signal path of a matching network; and
   a switched inductor circuit electrically separated from the signal path, wherein the switched inductor circuit is a floating circuit, the switched inductor circuit comprising:
   a second inductor having a first inductor terminal and a second inductor terminal;
   a third inductor coupled in parallel with the second inductor; and
   a first switch having a first switch terminal and a second switch terminal, the first switch terminal coupled to the first inductor terminal and the second switch terminal coupled to the second inductor terminal, wherein the first switch is configured to selectively enable or disable mutual coupling of the at least one first inductor and the second and third inductors.

2. The device of claim 1, wherein the second inductor includes a plurality of inductors.

3. The device of claim 2, wherein a the second inductor includes a fourth inductor, a fifth inductor, and a second switch, wherein the second switch is coupled between the fourth and fifth inductors, wherein the fourth inductor is configured to mutually couple to the at least one first inductor when the first and second switches are configured in a first configuration and the fifth inductor is configured to mutually couple to the at least one first inductor when the first and second switches switch are configured in a second configuration.

4. The device of claim 3, wherein the fourth inductor is configurable to have a first electrical configuration with the fifth inductor when the one or more switches are configured in a first configuration and is configurable to have a second electrical configuration with the fifth inductor when the one or more switches are configured in a second configuration.

5. The device of claim 1, wherein the third inductor includes a plurality of inductors.

6. A device comprising:
   at least one first inductor in a signal path of a matching network; and
   a switched inductor circuit electrically separated from the signal path, wherein the switched inductor circuit is a floating circuit, the switched inductor circuit comprising:
   a second inductor having a first inductor terminal and a second inductor terminal, wherein the second inductor includes a third inductor, a fourth inductor, and a second switch, wherein the second switch is coupled between the third inductor and the fourth inductor, wherein the first and second switches are configured to enable mutual coupling of the at least one first inductor and the third inductor when the first and second switches are in a first configuration, and wherein the first and second switches are configured to enable mutual coupling of the at least one first inductor and the third and fourth inductors when the first and second switches are in a second configuration; and a first switch having a first switch terminal and a second switch terminal, the first switch terminal coupled to the first inductor terminal and the second switch terminal coupled to the second inductor terminal, wherein the first switch is configured to selectively enable or disable mutual coupling of the at least one first inductor and the second inductor.

7. The device of claim 6, wherein the third inductor includes multiple inductors.

8. The device of claim 7, wherein the fourth inductor includes multiple inductors.

9. The device of claim 6, wherein the first switch is configured to enable mutual coupling of the at least one first inductor and at least two second inductors when the first switch is in a first configuration and when the first switch is in a second configuration, and wherein the at least two second inductors are in a first electrical configuration when the first switch is in the first configuration and are in a second electrical configuration when the first switch is in the second configuration.

10. The device of claim 9, wherein the signal path of the matching network presents a first effective impedance when the first switch is in the first configuration and presents a second effective impedance when the first switch is in the second configuration.

11. The device of claim 6, wherein the signal path of the matching network presents a first effective impedance when the first and second switches are in the first configuration and presents a second effective impedance when the first and second switches are in the second configuration.

12. The device of claim 6, wherein the first switch includes a plurality of switches.

13. A method comprising:
receiving a control signal to tune a matching network; and
selectively enabling or disabling, responsive to the control signal, current to flow through at least one auxiliary inductor that is coupled to a primary inductor located along a signal path of the matching network, the at least one auxiliary inductor is in a floating circuit and is electrically separated from the signal path of the matching network, wherein the at least one auxiliary inductor includes a plurality of inductors, and wherein selectively enabling current to flow through the plurality of inductors comprises configuring one or more switches coupled to the plurality of inductors responsive to the control signal.

14. The method of claim 13, wherein receiving the control signal includes receiving a first control signal to tune the matching network based on a first frequency.

15. The method of claim 14, wherein selectively enabling current to flow through the plurality of inductors includes configuring the one or more switches in a first configuration responsive to the first control signal.

16. The method of claim 15, further comprising receiving a second control signal to tune the matching network based on a second frequency.

17. The method of claim 16, further comprising configuring the one or more switches in a second configuration responsive to the second control signal.

18. The method of claim 17, wherein one or more first inductors of the plurality of inductors are mutually coupled to the primary inductor when the one or more switches are in the first configuration, and wherein one or more second inductors of the plurality of inductors are mutually coupled to the primary inductor when the one or more switches are in the second configuration.

* * * * *